United States Patent [19]
Lemonon et al.

[11] 4,284,921
[45] Aug. 18, 1981

[54] POLYMERIC PIEZOELECTRIC TRANSDUCER WITH THERMOFORMED PROTUBERANCES

[75] Inventors: Claire Lemonon; François Micheron; Pierre Wang, all of Paris, France

[73] Assignee: Thomson-CSF, Paris, France

[21] Appl. No.: 961,013

[22] Filed: Nov. 15, 1978

[30] Foreign Application Priority Data

Nov. 17, 1977 [FR] France ............... 77 34589

[51] Int. Cl.³ .......................................... H01L 41/08
[52] U.S. Cl. ........................... 310/328; 310/800; 310/335; 310/322; 310/329; 179/110 A
[58] Field of Search ............... 310/311, 328, 321, 800, 310/329, 339; 179/110 A

[56] References Cited

U.S. PATENT DOCUMENTS

| | | | |
|---|---|---|---|
| 2,006,558 | 7/1935 | Mueller ................. | 310/311 X |
| 2,500,473 | 3/1950 | Spaeth ................... | 310/311 X |
| 3,321,648 | 5/1967 | Kolm ...................... | 310/321 |
| 3,324,317 | 6/1967 | Hazelet .................. | 310/329 |
| 3,792,204 | 2/1974 | Murayama et al. ... | 310/800 X |
| 3,798,474 | 3/1974 | Cassand et al. ...... | 310/800 X |
| 3,816,774 | 6/1974 | Ohnuki et al. ........ | 310/800 X |
| 3,832,580 | 8/1974 | Yamamuro et al. .. | 310/800 X |
| 3,935,485 | 1/1976 | Yoshida et al. ....... | 310/800 X |
| 4,008,408 | 2/1977 | Kodama ................. | 310/800 X |
| 4,056,742 | 11/1977 | Tibbetts ................ | 310/800 X |
| 4,064,375 | 12/1977 | Russell et al. ........ | 310/800 X |
| 4,068,144 | 1/1978 | Toye ...................... | 310/328 X |
| 4,106,933 | 8/1978 | Taylor ................... | 310/311 X |

FOREIGN PATENT DOCUMENTS

| | | | |
|---|---|---|---|
| 2738220 | 3/1978 | Fed. Rep. of Germany ....... | 310/800 |
| 2805332 | 8/1978 | Fed. Rep. of Germany ....... | 310/800 |

Primary Examiner—Mark O. Budd
Attorney, Agent, or Firm—Cushman, Darby & Cushman

[57] ABSTRACT

The invention relates to devices using transducer elements comprising a film of piezoelectric polymer arranged between electrodes. The transducer element in accordance with the present invention is in the form of a thermoformed protuberance. These devices are used for detecting and generating elastic compression waves, for infrared radiation, and for storing electrical energy.

6 Claims, 15 Drawing Figures

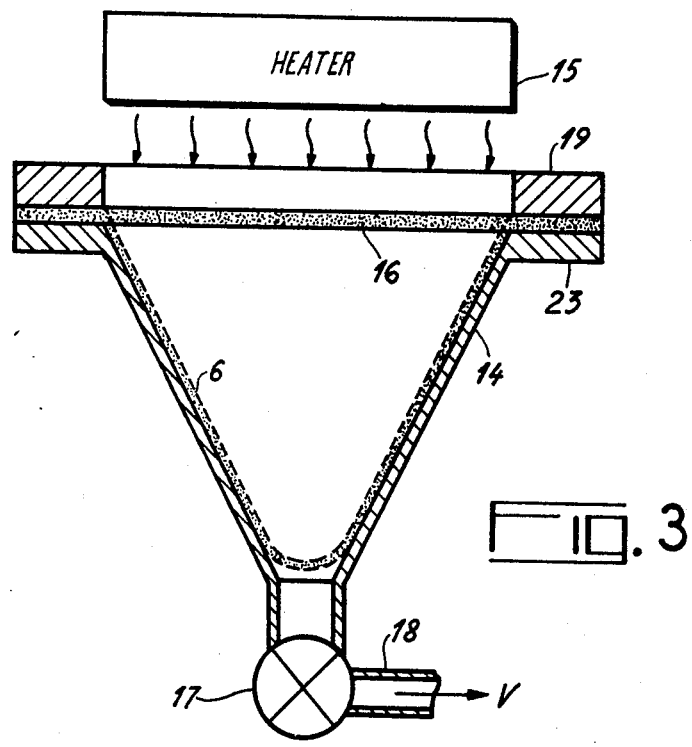
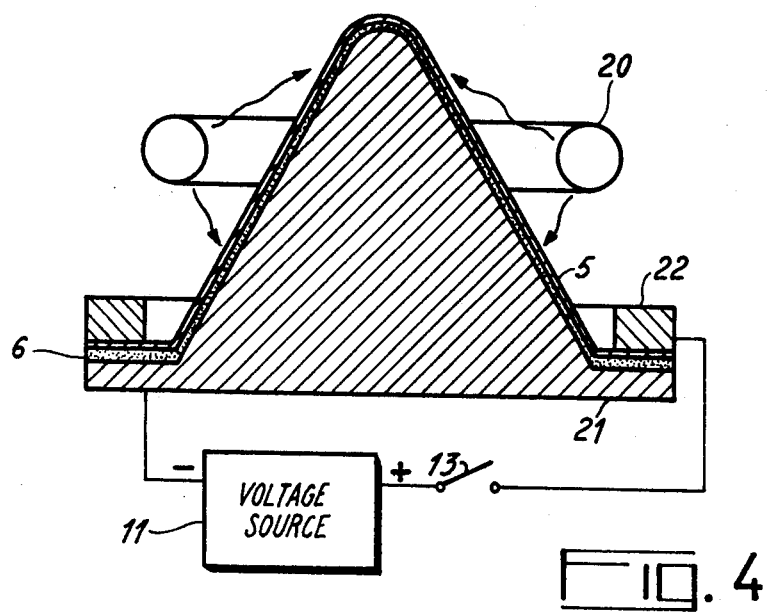

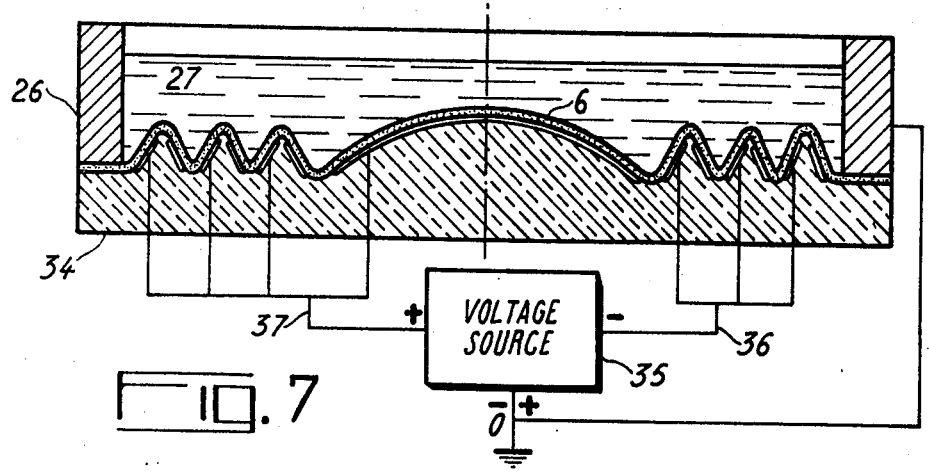
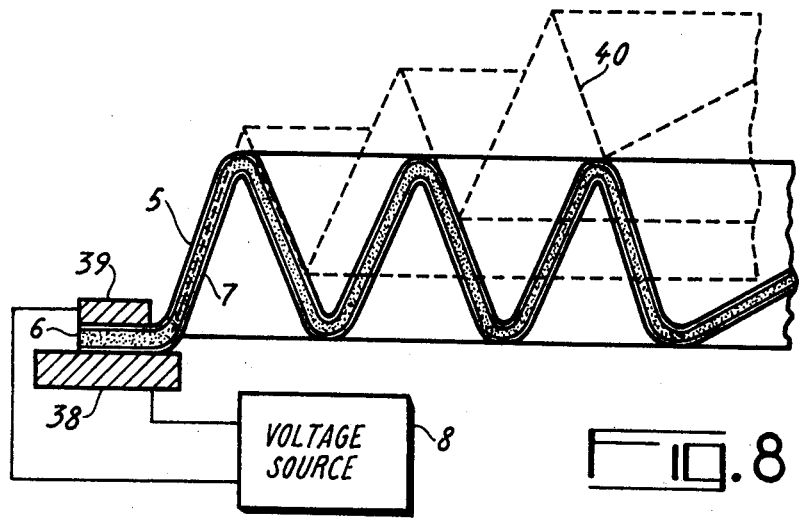
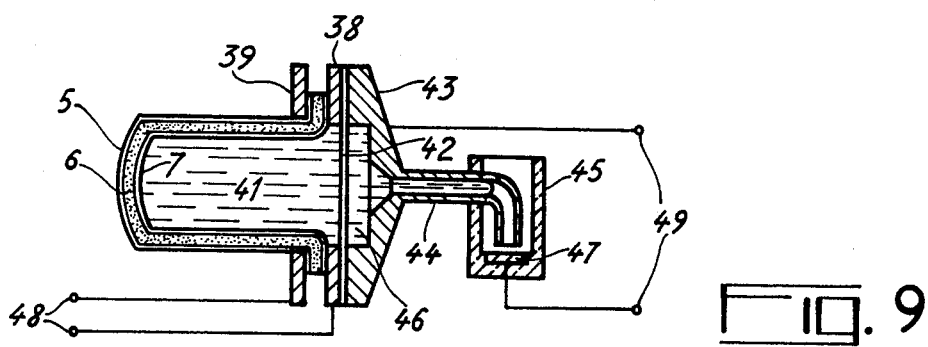

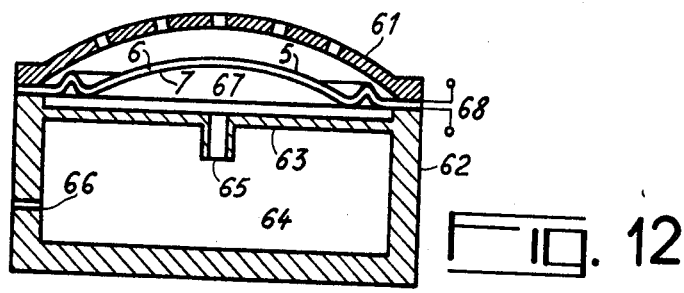
FIG. 12
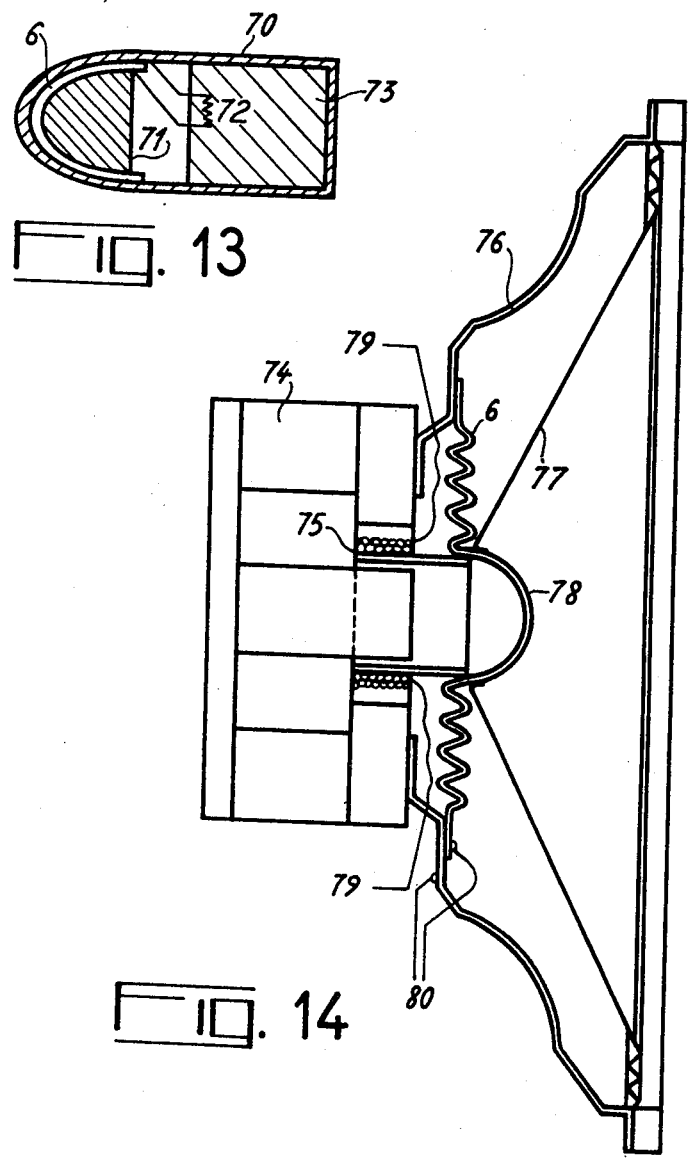
FIG. 13
FIG. 14

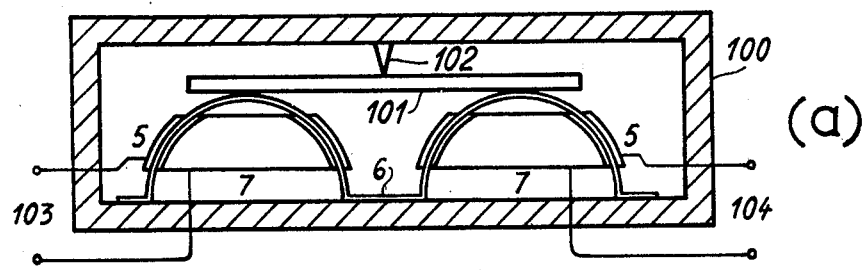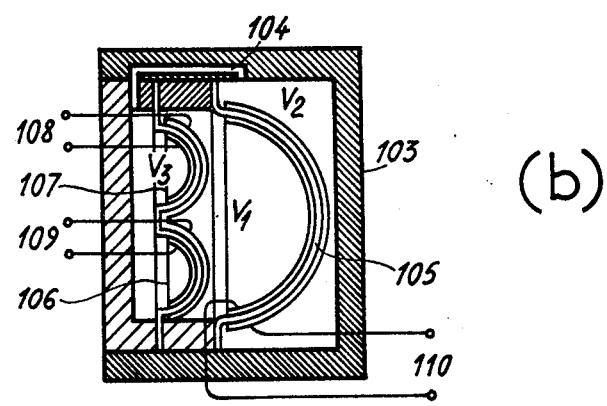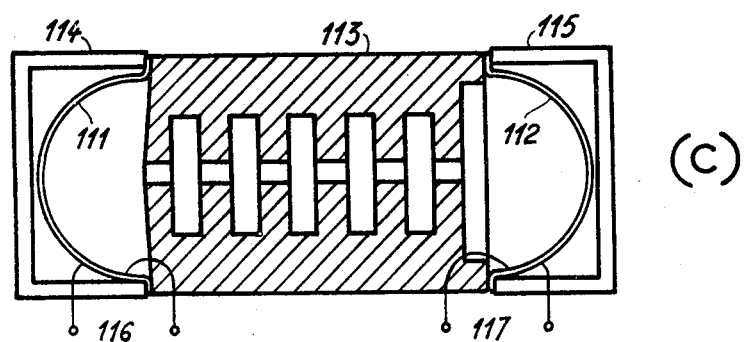
Fig. 15

POLYMERIC PIEZOELECTRIC TRANSDUCER WITH THERMOFORMED PROTUBERANCES

This invention relates to devices using as transducer element a film of piezoelectric polymer provided with electrodes on its two surfaces. The piezoelectric effect is developed by a treatment of the polymer which consists in extending its macromolecular chains in a predetermined direction and in subjecting the strained film to an electrical polarisation field. There are numerous polymers in which a piezoelectric effect of the type in question may be developed including for example polyvinylidene fluoride ($PVF_2$), polyvinyl fluoride (PVF), polyvinyl chloride (PVC) and also mixtures of these polymers.

The piezoelectric transducers are generally produced from a flat film of piezoelectric polymer whose major faces have been metallised. This previously strained and polarised film can be used for constructing transducer elements having a developable form, for example cylindrical or polyhedral. When the form is developable, it is necessary to provide means for holding the piezoelectric film because, on account of its thinness, the piezoelectric film has a tendency to sag under its own weight. With any non-rigid vibratory structure, it is difficult to convert the elongations of its surface into displaced volume without using a suitable supporting member. The presence of the supporting member for holding the film of piezoelectric polymer or for tensioning introduces an unnecessary complication into the structure of the transducer device. This supporting member may also adversely affect the radiating properties of the film of piezoelectric polymer. Since the film of piezoelectric polymer is flat at the outset, it is difficult for the film to move in a direction perpendicular to its faces uniformly and linearly in dependence upon the voltage applied.

In order to obviate these drawbacks, it is proposed in accordance with the present invention to subject a film of polymer to a thermoforming operation in order at least locally to obtain a transducer element of which the nondevelopable form is self-supporting. The straining resulting from the thermoforming operation produces an extension of the macromolecular chains which is essential to the development of the piezoelectric effect. The electrical biassing of the thermoformed film and the deposition of electrodes on its principal faces make it possible to obtain cumulative displacements or instead to limit the extend thereof.

In accordance with the present invention, there is provided a transducer device using a film of polymeric material capable of showing piezoelectric properties when strained in its plane and electrically biassed by a field applied in a direction normal to its faces, said transducer device comprising at least one transducer element formed by at least one thermoformed protuberance created in said film; the strained wall of this protuberance being electrically biassed and placed between electrodes forming a capacitor.

The invention also relates to a process for producing the above mentioned transducer device, characterised which comprises the following steps: thermoforming at least one protuberance in a film of polymeric material capable of showing piezoelectric properties when strained in its place and electrically biassed by a field applied in a direction normal to its faces; electrically biassing the strained wall of said protuberance and placing electrode along said strained wall for forming a capacitor.

For a better understanding of the present invention and show how the same may be carried into effect reference will be made to the following description in conjunction with the accompanying drawings, among which:

FIG. 3 shows a first step of the manufacturing process according to the invention.

FIG. 4 shows a further step of the manufacturing process according to the invention.

FIG. 7 shows a transducer element with annular corrugations and its mode of biassing.

FIG. 8 shows part of the transducer element illustrated in FIG. 7 and its displacement under the influence of an exciting voltage.

FIG. 9 shows a transducer device for the propulsion of a fluid.

FIG. 12 shows a transducer device fitted to a projectile for firing purposes.

FIG. 14 shows a transducer device fitted to an electrodynamic loudspeaker.

FIG. 15 shows several signal transmitting elements.

Figure 1:
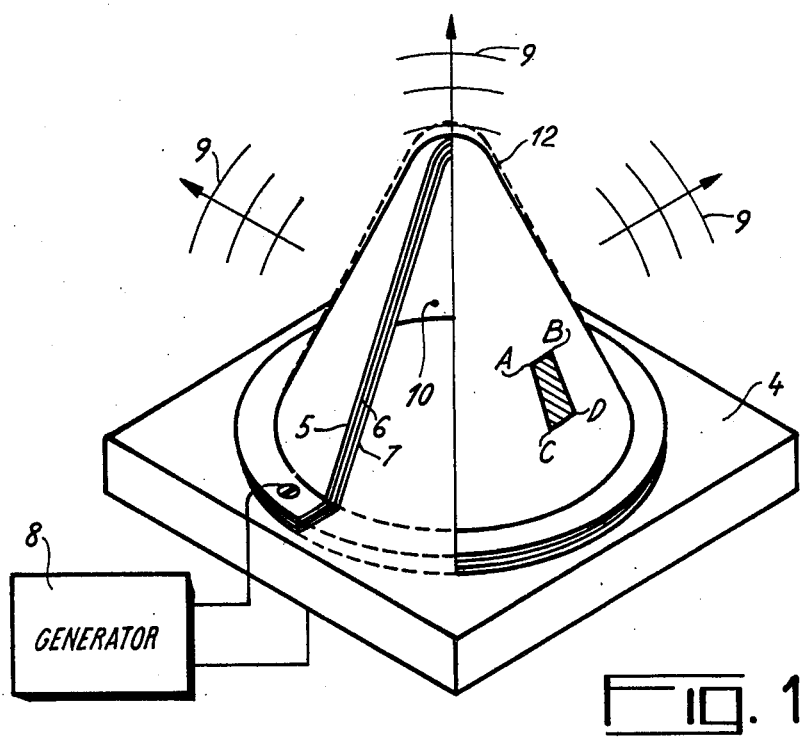
FIG. 1 is a partial isometric view of a piezoelectric transducer device according to the invention.

FIG. 1 shows a transducer device which is capable of radiating compression waves 9 in a fluid medium when an electrical a.c. voltage produced by a generator 8 is applied to it. An electromechanical transducer such as this lends itself to inverse operation, i.e. being mechanically excited by means of compression waves, it is capable of supplying an electrical a.c. voltage. The operation of this transducer as an acoustic wave transmitter is described by way of illustration in the following. This transmitter is in the form of a dome shaped protuberance which rests through its annular edge on a support 4. The wall of the dome is formed by a film 6 of thermoformed polymer and by electrodes 5 and 7 deposited on the two faces of the film 6. The dome 5, 6, 7 is produced from a film of polymer capable of showing piezoelectric properties when it is strained in its plane and electrically biassed by a field applied in a direction normal to its faces. The polymer film is initially flat and has no piezoelectric properties. By a thermoforming operation described hereinafter, it can be brought into the shape of a conical protuberance. After a suitable electrical biassing, the thermoformed film 6 is provided on its two faces with conductive deposits 5 and 7. The assembly thus obtained, electrically excited by the generator 8, is the seat of pulsations 12 which cause the dome alternately to expand and contract. The volume of air 10 present between the dome 5, 6, 7 and the support 4 is simply compressed. On the other hand, the outer face of the dome 5, 6, 7 radiates sound waves 9 at the frequency of the exciting voltage supplied by the generator 8. The operation of the device shown in FIG. 1 as a pulsating dome may be best understood by considering one of its strained elements A, B, C, D. This element ABCD is illustrated on a large scale in FIG. 2.

Figure 2:
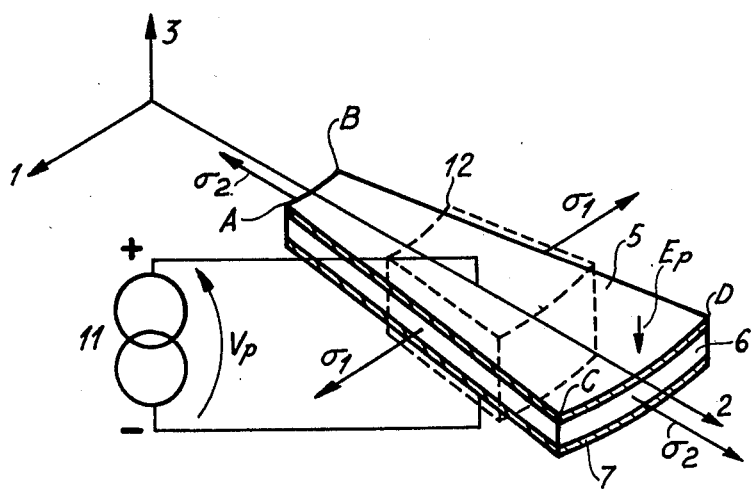
FIG. 2 is an explanatory Figure.

FIG. 2 shows in dotted lines an elementary volume 12 in the initial state, i.e. before the straining produced by the thermoforming operation has lead to the form ABCD. Referring to the system of axes 1, 2, 3, it can be seen that the volume 12 which contained helical macromolecular chains oriented in all directions has undergone stresses $T_1$ and $T_2$ contained in the plane 1, 2. Consequently, the element ABCD has ceased to be isotropic. Its macromolecular chains are spread out in the straining directions corresponding to the mechanical stresses $T_1$ and $T_2$. Once this structural anisotropy of the polymer 6 has been acquired, a biassing voltage $V_p$ produced by the biassing generator 11 is applied to the electrodes 5 and 7. An electrical field $E_p$ is thus created in the polymer 6, resulting in a rearrangement of the electrical charges in the macromolecular chains.

Having undergone the two treatments mentioned above, the polymeric element 6 has required piezoelectric properties. In particular, the piezoelectric constants $d_{31}$, $d_{32}$, and $d_{33}$ have acquired non-zero values which explains why an electrical exciting voltage applied to the electrodes 5 and 7 produces movements of the edges of the element ABCD in such directions that the volume 10 contained inside the dome shown in FIG. 1 tends to increase or decrease. Accordingly, it can be seen that the thermoforming of a polymeric fibre can give rise to a protuberance of which the envelope forms a self-supporting shell which, suitably biassed, may respond to an exciting voltage by a global displacement which tends to reproduce the final phase of deformation imposed on it by the thermoforming operation. The application of an exciting a.c. voltage helps the dome to "breath," the dome vibrating in all parts.

The polymeric materials suitable for the production of a piezoelectric transducer are numerous. They include in particular polyvinyl chloride (PVC), polyvinylidene fluoride ($PVF_2$) and polyvinyl fluoride (PVF). As will be seen hereinafter, the piezoelectric effect is not the only effect to be developed by the thermoforming and electrical biassing steps, because these treated materials show piezoelectric properties which enable them to be used as infrared radiation detectors.

FIG. 3 shows a machine for thermoforming the piezoelectric dome shown in FIG. 1.

This machine comprises a mould 14 in the form of a funnel of which the base is connected by a valve 17 to a pipe 18 communicating with a vacuum pump V. The upper part of the mould 14 is provided with an annular flange 23. With the valve 17 closed, a flat film 16 of polymer, for example polyvinyl chloride, is placed on the flange 23. A ring 19 co-operating with the flange 23 firmly grips the film 16 and, at the same time, renders fluid-tight the cell formed by the conical portion of the mould 14 and by the film 16. A heating device 15 softens the material forming the film 16. By opening the valve 17, the air contained in the fluid-tight cell is progressively pumped, causing the film 16 to sag under the effect of the atmospheric pressure. During the thermoforming operation, the film 16 undergoes considerable elongation with an increase in surface area of several times its value. On completion of the operation, the film 16 is in contact with the conical wall of the mould 14. Since the mould is at ambient temperature, the thermoformed film is set in the shape of the dome 6 shown in dotted lines.

The device shown in FIG. 4 may be used for electrically biassing the thermoformed dome. It comprises a conductive support 21 onto which the preformed dome 6 fits exactly. An electrode 5 has already been deposited on the outer surface of the dome 6. With the dome in position on its support 21, its edge is held in place by a conductive ring 22. The ring 22 and the support 21 are connected by a switch 13 to a d.c. voltage source 11. The dome is heated by a heat source 20 and the biassing voltage is applied to it for a predetermined period by closing the switch 13. The support prevents the dome from collapsing or curling up under the effect of softening. It also co-operates with the electrode 5 in creating the electrical biassing field $E_p$ according to the wall thickness of the dome. Although the field $E_p$ is strong, it should not disrupt the dielectric forming the thermoformed dome.

After electrical biassing, the thermoformed dome is provided on its inner surface with a conductive deposit forming the electrode 7. All that remains is to attach it to the support 4 which may be conductive for conveniently establishing the connection with the electrode 7. It is also possible to deposit the inner electrode before any voltage is applied. Anchorage of the electrodes on the polymer film is promoted if the faces are treated by Corona discharge.

By way of non limiting example, a tweeter intended for the reproduction of acoustic frequencies above 5 kHz was produced in accordance with the diagrams of FIGS. 1, 3 and 4. The starting material was a PVC film approximately 40 μm thick. This film was thermoformed by suction at 90° C. in a conical mould having a base diameter of 8 cm and a height of 7 cm. The rounded tip of the thermoformed dome merges with the conical part around a circumference equal to 1.5 cm in diameter. The dome is then cold-metallised on its outer surface by painting with silver. It is then placed in the mould 21 shown in FIG. 4 where it is electrically biassed at 120° C. by the application of a d.c. voltage of the order of 3000 V. The voltage is applied for 1 hour and the dome is left to cool before the voltage is switched off. The inner surface of the dome is in turn painted with a layer of silver. The assembly is then mounted on a rectangular baffle measuring 20 cm×30 cm and provided with a circular opening. The dome is fixed to this opening at its edge. By applying an a.c. voltage of 100 V peak-to-peak between the electrodes 5 and 7, a sufficient acoustic level was obtained for the tweeter in question to be able to be used as a high frequency radiator in a conventional acoustic enclosure. As such, the polymer loudspeaker has a response curve with a maximum around a frequency of 10 kHz. This peak is due to the natural resonance of the dome. It may be eliminated by placing inside the dome a cone cut from a polyurethane foam. Thus corrected, the response curve no longer shows any significant irregularity. The radiation is only very slightly directional because the dome functions more like a pulsating sphere than a simple flat piston.

The example which has just been mentioned shows that, by thermoforming, it is possible to obtain a structure vibrating as a whole so that it is propulsive in all its parts. This structure is self supporting because it follows the shape of a shell. Since the shape is perfectly reproducible, the characteristics of the transducer are also reproducible. In addition, since this loudspeaker comprises neither a magnet nor a moving coil, it is cheap and inexpensive to manufacture.

In the foregoing, it has been seen that the thermoforming operation associated with the electrical biassing enable a conical protuberance capable of forming an excellent electroacoustic transducer to be formed from a film of polymer. A transducer of this type is perfectly suitable for radiating or detecting acoustic waves in air. It performs the same functions even better when it comes to transmitting or receiving ultrasonic waves in water. In this case, since the constituent material has a mechanical impedance of the same order as the liquids in which the waves are propagated, it interferes minimally with the propagation of the waves, which is a significant advantage.

Figure 5:
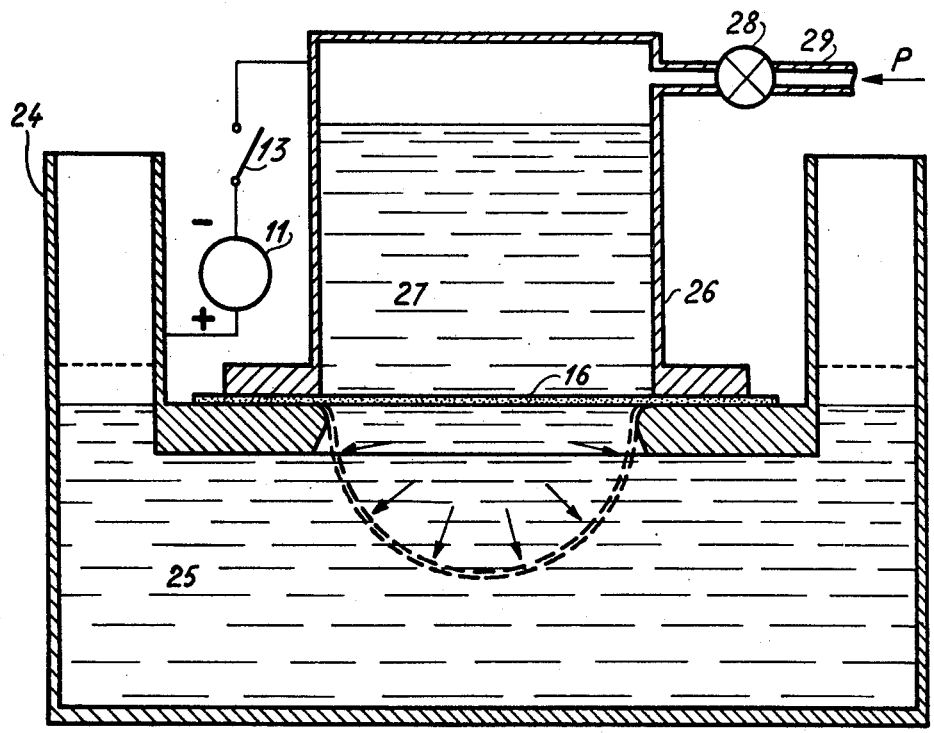
FIG. 5 shows a variant of the manufacturing process according to the invention.

FIG. 5 shows an apparatus enabling a protuberance in the form of a spherical cap to be obtained by thermoforming. This apparatus comprises a tank 24 containing a liquid 25. At its centre, the tank 24 comprises a seating with raised edges on which the film 16 of polymer to be thermoformed is placed. A central circular opening formed in the seating of the tank 24 delimits that portion of the film 16 which is to be subjected to thermoforming. A bell-jar 26 resting firmly on the film 16 holds it at its edges. The bell-jar 26 contains a liquid 27 which acts as a liquid plunger for thermo-forming that part of the film 16 which overhangs the circular opening formed in the seating of the tank 24. The bell-jar 26 communicates through a valve 28 with a pipe 29 carrying gas under high pressure P. The liquids 25 and 27 are heated to a temperature favourable to the thermoforming operation by heating elements (not shown). The liquids 25 and 27 are rendered electrically conductive by means of suitable ions. The tank 24 and the bell-jar 26 are made of conductive materials. They are electrically insulated from one another by the film 16 which also acts as a seal. A d.c. voltage source 11 connected to the tank 24 supplies the voltage for biassing the film 16. The other terminal of the source 11 is connected to the bell-jar by the switch 13. It can be seen that, by closing the switch 13, the biassing voltage is directly applied to the two sides of the film 16.

When the thermoforming temperature is reached throughout the film 16, the valve 28 is opened. The pressure P is transmitted by the liquid 27 to the film 16 which is extended downwards into a protuberance in the shape of a spherical cap. This shape is obtained without the assistance of a mould because the pressure applied by the liquid 27 is hydrostatic. The electrical biassing is effective during thermoforming, although its action may be continued after the required shape has been reached (dotted lines in FIG. 5). The method of thermoforming illustrates in FIG. 5 is not limited to the formation of protuberances in the form of spherical caps. By forming the seating of the tank 24 by means of removable elements, it would be possible to thermoform a protuberance comprising a central spherical cap sourrounded by annular corrugations, as shown in FIG. 7. The thermoforming of a spherical cap may also be continued beyond the hermispherical form. Alternatively, it is possible to produce on a principal spherical cap small secondary protuberances of which the edges rest on a cell formed with openings which has been placed below the seating of the tank 24. The secondary protuberances may act as a reinforcing framework.

Application of the film 16 and removal of the thermoformed protuberance necessitates decantation of the liquids 25 and 27. This decantation may be carried out by means of auxiliary reservoirs (not shown in FIG. 5). Similarly, to balance the pressures acting on either side of the thermoformed structure, the tank 24 and the bell-jar 26 may be connected with one another.

Figure 6:
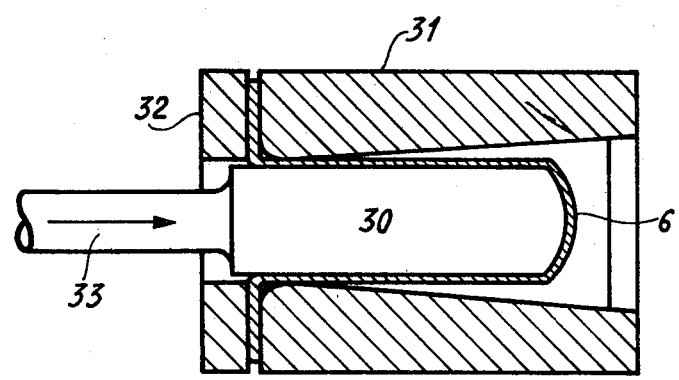
FIG. 6 shows another variant of the manufacturing process according to the invention.

The thermoforming apparatus described above use a gas or liquid pressure for extending the film of polymer. FIG. 6 shows a thermoforming apparatus which operates by stamping. It comprises a stamp 30, a die 31 and a ring 32. This ring holds the film to be thermoformed on the die. The descent of the stamp 30 in the direction 33 enables a cylindrical protuberance 6 to be obtained. In this case, straining remains confined to the lateral cylindrical wall of the protuberance because frictional forces prevent the base of the protuberance from sliding on the head of the stamp. Naturally the thermoforming operation takes place under heat and is preferably carried out with a stamp heated to the softening temperature of the polymeric film. According to the invention, thermoforming by hot stamping may be carried out by means of dies and stamps machined to a complex profile, such as that illustrated in FIG. 7.

FIG. 7 shows an electrical biassing device which is particularly suitable for producing thermoformed membranes capable of undergoing large displacements.

The thermoformed film 6 is in the form of a central protuberance in the shape of a spherical cap associated with annular protuberances forming corrugations. In a case such as this, it is of advantage for the direction of the electrical biassing to be reversed on passing from one side of a corrugation to the next. To this end, the thermoformed film is placed on an insulating support 34 of which the upper surface adheres exactly to its profile. The central protuberance of the support 34 is metallised up to its base and is electrically connected to a terminal 34. The outer sides of the annular corrugations of the support 34 are also metallised and these metallisations are connected to the terminal 37. The inner sides of the annular corrugations of the support 34 receive metallisations which are connected to another terminal 36. A conductive ring 26 ensures that the thermoformed film remains in position on its support 34. The biassing voltage source 35 comprises a neutral terminal 0 which is connected to the ring 26. It supplies a positive voltage to the terminal 37 and an equal voltage of opposite sign to the terminal 36. A conductive liquid 27 covering the upper face of the thermoformed film 6 places it at the potential of the neutral terminal 0. In this way, alternate biassing fields are obtained on passing from the outer side of a corrugation to its inner side.

FIG. 8 shows part of the thermoformed film 6 illustrated in FIG. 7. Electrodes 5 and 7 have been deposited on the two faces of the film 6. This film is gripped at its edge between two conductive rings 38 and 39 which act as supports. The exciting voltage is supplied by the generator 8 connected to the rings 38 and 39. Under the effect of the exciting voltage, the sides of the corrugations inclined in one direction are lengthened whilst the sides inclined in the other direction are shortened. This results in an addition of the displacements in the vertical direction. This cumulated displacement is illustrated by the dotted line 40. By this technique of biassing, it is possible to produce a vibrating piston having considerable elongations. To this end, a large number of tall corrugations separated by narrow intervals has to be formed at the periphery of the film 6. The thermoformed film shown in FIG. 7 is particularly suitable for the formation of self-acting diaphragms of high mechanical compliance. These diagrams enable the use of the thermoformed transducers to be extended to loudspeakers intended to reproduce the medium and low register with a suitable acoustic power. The central spherical cap may be used more particularly for ensuring the non-directional radiation of the high frequencies of the acoustic spectrum.

Deposition of the electrodes 5 and 7 on the two faces of the thermoformed film 6 may be carried out in particular by conductive painting, electroplating, chemical silver plating, vacuum evaporation, chopping and cathode sputtering. In certain applications, the extent of the electrodes may be limited to certain zones of the thermoformed film so as to confine the transducer effect. This result from the fact that the transducer effect is only achieved in regions which are simultaneously thermoformed, electrically biassed and coated with oppositely situated electrodes. This three-fold condition enables the piezoelectric effect to be gauged by acting on one of the three components. Accordingly, thermoforming, electrical biassing or the deposition of electrodes may be carried out in zones either separately or in combination.

So far as electrical biassing is concerned, the application of an electrical field $E_p$ is only one means among others. It is also possible (as is standard practice in the technique of electrets) to obtain electrical biassing of the thermoformed film by Corona discharge or by ion implantation.

The transducer devices described above are used as transmitters or detectors for vibratory waves. They receive or deliver an electrical a.c. voltage which corresponds to the creation or to the detection of an acoustic or ultrasonic pressure.

The transducer device shown in FIG. 9 may operate under the control of a staggered or pulsed voltage applied to the terminals 48. The thermoformed film 6 assumes the form of a cylindrical protuberance obtained for example by means of the apparatus shown in FIG. 6. Its electrodes 5 and 7 extend to the edge of the cylindrical wall which is gripped between two conductive rings 38 and 39. A flexible insulating membrane 42 closes the opening of the cylindrical body 5, 6, 7. A fluid 41 fills the space between the polymeric film 5, 6, 7 and the membrane 42. A cover 43 provided with an aperture 46 is applied to the membrane 46. The aperture 46 communicates with a capillary tube 44 and the assembly accommodates a liquid to which the membrane 46 is capable of applying a pressure. This pressure is produced by contraction of the cylindrical body 5, 6, 7 when it is excited by an electrical voltage applied to the terminals 48. As a result, the meniscus is displaced towards the free end of the capillary tube 44. As shown in FIG. 9, the end of the capillary tube 44 opens into an insulating cap 45 of which the base is provided with an electrical contact 47. Assuming that both the capillary 44 and the liquid which it contains are conductive, it can be seen that, when this liquid issues from the capillary under the effect of a control voltage applied to the terminals 48, an electrical contact closes between the terminals 49 which are respectively connected to the conductive cover 43 and to the contact 47. The conductive liquid may with advantage be formed by mercury. When the control voltage is removed, the membrane 42 flows back to the left, the effect of which is to break the wetted contact. The film of thermoformed polymer is thus entirely suitable for controlling a displacement. However, instead of making the device 9 operate on the lines of an electromechanical relay, it is possible to use the device for projecting a jet of liquid. In this version, the end of the capillary is equipped with a nozzle. In addition, a feed pipe connected between the nozzle and the membrane 42 is connected to a liquid reservoir. When a brief pulse is a applied to the terminals 48, a jet of liquid is projected by the nozzle. Between two controls pulses, the ejected liquid is replaced by an equal quantity supplied by the reservoir. In this variant, the membrane 42 may be omitted because the liquid coming from the reservoir may safety occupy the entire volume delimited by the capillary 44, the cover 43 and the thermoformed cylindrical body 5, 6, 7. By using an ink of suitable fluidity as the filling liquid, the device may be used for recording characters on a suitable support.

As mentioned above, there is added to the piezoelectric effect a pyroelectric effect which may be used for example for detecting infrared radiation.

Figure 10:
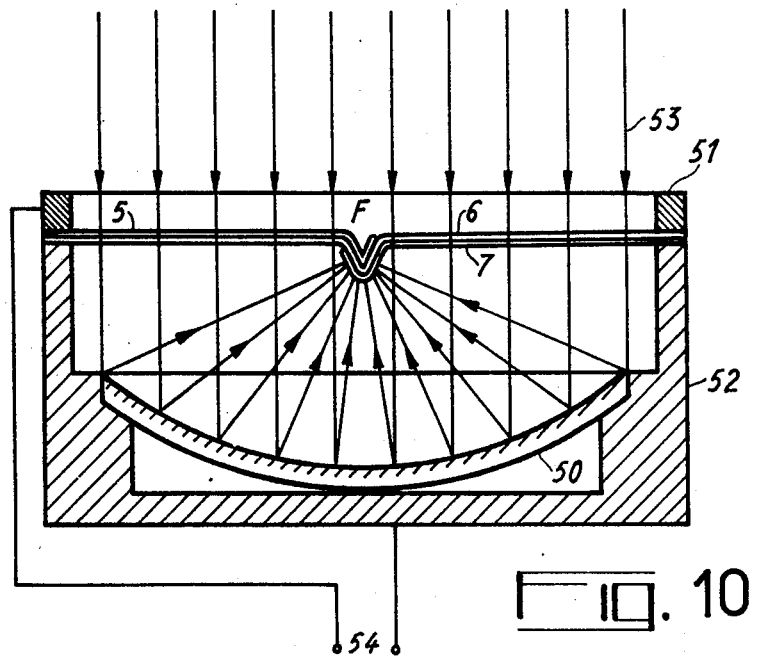
FIG. 10 shows a transducer device which may be used as an earphone.

A detector such as this is shown in FIG. 10. It comprises a casing 52 at the bottom of which a concave mirror 50 is mounted. The incident infrared radiation 53 passes through a polymeric film 6 and is reflected at the centre F of the mirror 50. The central zone of the film 6 is thermoformed to form a conical protuberance situated at the centre F. The two faces of this protuberance are provided with electrodes 5 and 6 which extend radially towards the periphery of the film 6. The extension of the electrode 5 is in contact with a ring 51 whilst the extension of the electrode 7 is in contact with the conductive casing 52. Output terminals 54 are respectively connected to the casing 52 and to the ring 51. The outer surface of the central protuberance is blackened in order to absorb the infrared radiation concentrated by the mirror 50 as effectively as possible. Local heating of the central protuberance biassed beforehand results in the appearance of an electrical voltage at the terminals 54. The major part of the film 6 does not absorb the incident infrared radiation 53. Since in addition it has a very low thermal conductivity, the central protuberance may be heated without any loss of heat by conduction. The detector thus formed shows high sensitivity, low thermal inertia anf good directivity. It is particularly inexpensive to produce, in addition to which the mirror is effectively protected against tarnishing.

A finer analysis of the infrared radiation may be obtained by adopting a matrix arrangement of small protuberances. To each protuberance there corresponds a pair of terminals 54 which delivers a signal representative of an element of an infrared image formed on the film 6 by the mirror 50. Cyclic analysis of the voltages collected then enables the source of infrared radiation to be displayed on a screen.

Figure 11:
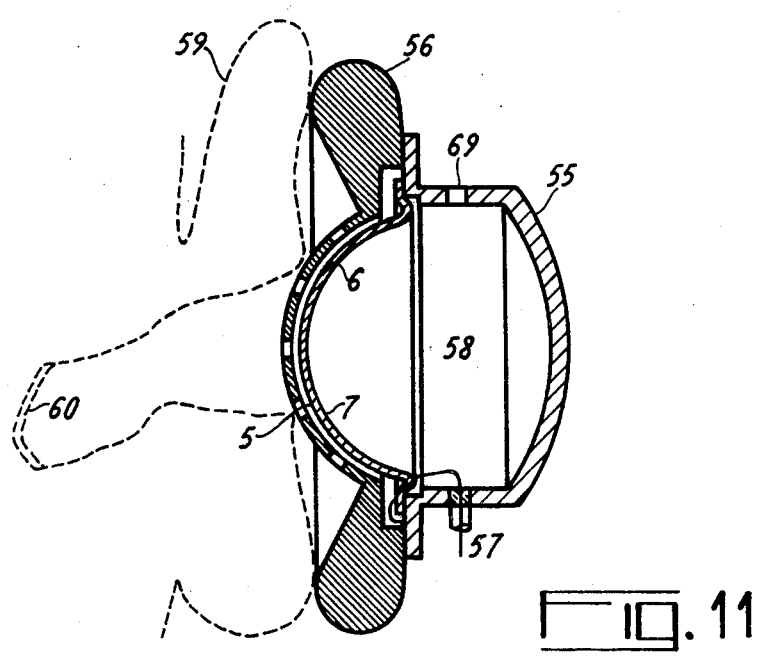

FIG. 11 shows an earphone using a thermoformed cap 6 provided on its two surfaces with electrodes 5 and 7. The earpiece 56 comprises a perforated grid which follows the outline of the cap 6. When it is applied to the auricle of the ear 59, the volume of air present between the eardrum 60 and the cap 6 is reduced. The earphone comprises a casing 55 of which the flange carries the cap 6. The volume of air 58 enclosed between the cap 6 and the casing 55 forms a pneumatic spring which increases the stiffness of the suspension of the cap 6. An orifice 69 of very small diameter enables the internal and external pressures to be balanced, although it does not affect the acoustic characteristics of the earphone in the range of frequencies to be reproduced. The electrodes 5 and 7 are connected to a supply cable 57. The volume of the auditory passage is compressed by the displacement of the cap 6 under the effect of the voltage applied to the terminals of the cable 57. The frequency response is relatively flat up to the natural resonance frequency of the cap which is situated at the high end. Filling the base 58 with glass wool enables the resonance frequency to be lowered and the response curve to be improved. In the case of a miniaturised earphone, the use of a thermoformed protuberance as membrane enables the membrane to be inserted into the auditory passage, in which case the earpiece 56 assumes the form of a mouthpiece. An earphone such as this is extremely light, easy to wear and aesthetic in appearance.

FIG. 12 shows a microphone of which the diaphragm 6 is formed by a thermoformed film. The diaphragm 6 is gripped between a protective grid 61 and a casing 62. A balancing orifice 66 provides for the equalisation of pressures. The casing 62 is provided with a separating wall 63 at the centre of which there is a vent 65. A first volume of air 67 is enclosed between the diaphragm 6 and the separating wall 63. A second volume of air 64 is present between the bottom of the casing 62 and the separating wall 63. Electrodes 5 and 7 cover the faces of the diaphragm 6 and are respectively connected to the output terminals 68. The diaphragm 6 vibrates under the influence of the incident acoustic pressure which is built up between the grid 61 and the diaphragm 6. At high frequencies, only the volume of air 67 is acoustically compressed because the inertia of the vent prevents transmission of the acoustic pressure. At lower frequencies, the vent 65 vibrates and adds its inertia to that of the diaphragm 6, although the volume of air 64 is only lightly compressed. At even lower frequencies, the inertia of the vent 65 becomes negligible and the two volumes of air 67 and 64 are added to one another so that the diaphragm is not excessively stiffened. The presence of the acoustic elements 67, 65 and 64 contributes towards enlarging the response curve of the microphone. By using friction at the level of the vent 65 and by suitably filling the space 64 with glass wool, it is possible to damp the resonances and to obtain a highly regular response curve.

FIG. 13 shows a dome 6 of thermoformed polymer accomodated in the cap of a projectile 70. It can be shown that a volume of the order of 1 cubic centimeter of polyvinylidene fluoride is capable of restoring an electrical energy of the order to 1 joule when it is suddenly crashed. This electrical energy is sufficient to detonate an explosive charge 73 containing an electrical fuse 72. The dome 6 is wedged between the wall of the cap of the projectile 70 and a floating means 71. The cap and the floating mass are connected to the fuse 72. When the projectile reaches its target, the sudden deceleration causes the thermoformed dome to be crashed and the charge 73 to be detonated.

FIG. 14 shows an electromagnetic transducer of the conventional type in which a thermoformed piezoelectric transducer according to the invention is used. The transducer in question is designed for use in an electrodynamic loadspeaker comprising a permanent magnet 74 with an annular air gap, a moving coil 75 inserted in this air gap and a cone 77 of which the peripheral suspension is fixed to the flange of a bowl 76. By passing an ac. current between the terminals 79 of the moving coil 75, the moving coil is moved along its axis and drives the cone 77 by its tip. In normal loadspeakers, the moving coil has to be centred in relation to the air gap by means of a spider in the form of an impregnated textile forming a diaphragm with concentric corrugations. According to the invention, this spider is replaced by a thermoformed polymer film 6 provided at its centre with an emissive cap 78. The corrugations of the diaphragm 6 and the cap 78 are electrically biassed after thermoforming in accordance with the diagram of FIG. 7. Electrodes deposited on the faces of the undulating portion of the spider 6 are connected to output terminals 80. The cap 78 is also provided on its two faces with electrodes connected to input terminals (not shown).

The use of a suspension formed by a thermoformed piezoelectric transducer diaphragm makes it possible on the one hand to transmit high frequency sounds by the cap 78 which acts as a tweeter integrated with the principal cone 77. On the other hand, since the spider 6 connects the bowl 76 to the moving coil, the displacement of the moving coil is reflected in the appearance of a proportional voltage between the terminals 80. By connecting the moving coil 75 to a negative feedback amplifier, the voltage available between the terminals 80 may be used for controlling the vibratory movement of the cone 77, so that it is possible to obtain a highly uniform response curve at low frequencies and a significant reduction in the non-linearities which occur when the amplitude of displacement of the cone is significant.

The example of FIG. 14 shows that it is of advantage mechanically to couple two electromechanical transducers. By virtue of the fact that it is easy to produce, the thermoformed piezoelectric transducer is entirely suitable for replacing the electrodynamic motor 74, 75. In this connection, two thermoformed piezoelectric diaphragms may be connected mechanically, pneumatically or hydraulically to form an electrical signal transmitting element having two pairs of terminals. A transmitting element such as this may be used in the production of filters. It may also be used for transmitting a control voltage between points of an electrical circuit which are at very different potentials. In this capacity, it is much lighter than a transformer and is capable of transmitting the d.c. component of a signal. Naturally a single thermoformed diaphragm provided with two sets of electrodes may be sufficient for producing a transmitting element of the type in question.

FIG. 15(a) shows a transmitting element having two pairs of terminals 103 and 104. It comprises a casing 100 in which is disposed a thermoformed polymer film 6 having two adjacent protuberances respectively provided with electrodes 5 and 7 connected to the terminals 103 and 104. Mechanical coupling is established by a lever 101 braced between the tops of two thermoformed caps and a pivot 102. By displacing the pivot 102 along the lever 101, it is possible to adjust the transformation ratio.

FIG. 15(b) shows a transmitting element comprising two input channels 108 and 109 and one output channel 110. The casing 104 contains three thermoformed protuberances 105, 106 and 107 which delimit a coupling volume $V_1$ and two volumes $V_2$ and $V_3$ interconnected by a passage 104. On the output channel, this transducer device supplies a linear combination of the voltages applied to the channels 108 and 109. Depending on the electrical biasses, it may be used for adding or subtracting two voltages.

FIG. 15(c) shows a low-pass filter using two thermoformed caps 111 and 112 of which the electrodes are connected to the pairs of terminals 116 and 117. The caps are surrounded by covers 114 and 115 and are acoustically coupled to one another by a body 113 in which an alternating sequence of vents and cavities performs the low-pass transfer function.

What we claim is:
1. A transducer device using a film of polymeric material capable of showing piezoelectric properties when it is strained in its plane and electrically biassed by a field applied in a direction normal to its faces, said transducer device comprising at least one transducer element formed by a least one thermoformed protuberance created in said film; the strained wall of said protuberance being electrically polarized and disposed between electrodes forming a capacitor; said protuberance being formed by adjacent annular corrugations and a central dome; said protuberance forming a diaphragm; the sides of said corrugations being electrically biassed by oppositely directed electrical fields; two sets of electrodes being deposited on said protuberance; one of said sets covering the faces of said annular corrugations and the other of said sets covering the faces of said central dome; said diaphragm being mechanically coupled with an electromechanical transducer; said electromechanical transducer being a loudspeaker motor driving a cone surrounding said central dome; said diaphragm acting as a suspension for the cone and as a means for detecting its movements.

2. A transducer device as claimed in claim 1, wherein said central dome transmits the higher frequencies of the acoustic range whilst said cone transmits the lower frequencies thereof.

3. A transducer device using a film of polymeric material capable of showing piezoelectric properties when it is strained in its plane and electrically biassed by a field applied in a direction normal to its faces, said transducer device comprising at least one transducer element formed by a least one thermoformed protuberance created in said film; the strained wall of said protuberance being electrically polarized and disposed between electrodes forming a capacitor; said protuberance having a major face intended to create an acoustic pressure in the auditory passage of the ear; the other major face compressing the air enclosed in a casing; the acoustic pressure being produced under the control of a.c. voltage applied to electrodes covering said major faces; the convexity of said protuberance being directed towards the auditory passage.

4. A transducer device using a film of polymeric material capable of showing piezoelectric properties when it is strained in its plane and electrically biassed by a field applied in a direction normal to its faces, said transducer device comprising at least one transducer element formed by a least one thermoformed protuberance created in said film; the strained wall of said protuberance being electrically polarized and disposed between electrodes forming a capacitor; said protuberance forming a hollow body of which the inner volume varies under the control of an electrical voltage applied to the electrodes; the variation in volume exerting a pressure on a liquid; said liquid being contained in a capillary tube; the pressure displacing the meniscus of said liquid towards the end of said capillary tube; an electrical contact placed opposite said end being wetted by said liquid when the pressure causes it to clear the end of said capillary tube.

5. A transducer device using a film of polymeric material capable of showing piezoelectric properties when it is strained in its plane and electrically biassed by a field applied in a direction normal to its faces, said transducer device comprising at least one transducer element formed by a least one thermoformed protuberance created in said film; the strained wall of said protuberance being electrically polarized and disposed between electrodes forming a capacitor, wherein said transducer element is irradiated by means of an incident infrared beam; said electrodes delivering an electrical voltage in response to the heating of said protuberance arising out of the absorption of said incident infrared beam, and wherein said protuberance is situated at the centre of a concave mirror which reflects said infrared beam transmitted by that portion of said polymer film which surrounds said protuberance.

6. A transducer device as claimed in claim 5, wherein at the centre of said polymer film, it comprises a network of N protuberances intended for the analysis of the image of the source of infrared radiation projected by said mirror; the electrodes associated with each of said N protuberances delivering N electrical voltages intended for the display of said infrared image.

* * * * *